US009413322B2

(12) United States Patent  (10) Patent No.: US 9,413,322 B2
Soulodre  (45) Date of Patent: Aug. 9, 2016

(54) AUDIO LOUDNESS CONTROL SYSTEM

(71) Applicant: Harman International Industries, Incorporated, Stamford, CT (US)

(72) Inventor: Gilbert Arthur Joseph Soulodre, Kanata (CA)

(73) Assignee: Harman International Industries, Incorporated, Stamford, CT (US)

( * ) Notice: Subject to any disclaimer, the term of this patent is extended or adjusted under 35 U.S.C. 154(b) by 501 days.

(21) Appl. No.: 13/833,657

(22) Filed: Mar. 15, 2013

(65) Prior Publication Data

US 2014/0140537 A1   May 22, 2014

Related U.S. Application Data

(60) Provisional application No. 61/728,234, filed on Nov. 19, 2012.

(51) Int. Cl.
  *H03G 3/00* (2006.01)
  *H03G 7/00* (2006.01)
  *H03G 5/00* (2006.01)
  *H03G 5/16* (2006.01)
  *H03G 9/00* (2006.01)
  *H03G 9/02* (2006.01)

(52) U.S. Cl.
  CPC ............... *H03G 7/00* (2013.01); *H03G 5/005* (2013.01); *H03G 5/165* (2013.01); *H03G 9/005* (2013.01); *H03G 9/025* (2013.01)

(58) Field of Classification Search
  None
  See application file for complete search history.

(56) References Cited

U.S. PATENT DOCUMENTS

| | | | |
|---|---|---|---|
| 5,784,476 A * | 7/1998 | Bird | 381/107 |
| 2008/0192958 A1* | 8/2008 | Nakata | 381/107 |
| 2008/0226101 A1* | 9/2008 | Silber et al. | 381/123 |
| 2008/0253586 A1 | 10/2008 | Wei | |
| 2010/0272290 A1 | 10/2010 | Carroll | |
| 2013/0101138 A1* | 4/2013 | Kubo et al. | 381/107 |

FOREIGN PATENT DOCUMENTS

EP   2352225 A1   8/2011

OTHER PUBLICATIONS

International Search Report and Written Opinion for corresponding Application No. PCT/US2012/067967, mailed Mar. 19, 2014, 15 pages.
International Preliminary Report for corresponding Application No. PCT/US2013/067967, mailed May 19, 2015, 10 pages.

* cited by examiner

*Primary Examiner* — Thang Tran
(74) *Attorney, Agent, or Firm* — Brooks Kushman P.C.

(57) ABSTRACT

An audio loudness control system includes a loudness adjuster module configured to adjust a level of an audio signal based on parameters associated with the audio signal. The parameters may include identification of a source of the audio signal. The parameters associated with the audio signal may be provided to the loudness adjuster in a message associated with the audio signal. The audio loudness control system may also include a database in communication with the loudness adjuster module. The loudness adjuster module may be configured to extract loudness related settings or parameters from the database that are associated with a source of the audio signal.

19 Claims, 14 Drawing Sheets

AUDIO LOUDNESS CONTROL SYSTEM

PRIORITY CLAIM

This application claims the benefit of priority from U.S. Provisional Application No. 61/728,234, filed Nov. 19, 2012, which is incorporated by reference.

BACKGROUND OF THE INVENTION

1. Technical Field

The present invention relates to audio systems, and more particularly to an audio loudness control system.

2. Related Art

Audio systems process audio signals containing audio content to drive loudspeakers. Volume control of the audio signals can be manually performed by a user. In addition, in the case of a motor vehicle, volume control of the audio signals can be automatically adjusted by the audio system based on an external input, such as the speed of the vehicle, or the revolutions per minute of the engine. Audio systems may also have some form of overload protection to avoid distortion or damage of the loudspeakers by the audio signals.

SUMMARY

An audio loudness control system may dynamically increase and decrease the energy of an audio signal in order to maintain the perceived loudness of the audio signals substantially the same as different audio sources are selected to provide the audio signals. Indication of selection of a new audio source may trigger adjustment of the energy level of respective audio signals of the new audio source. The indication of selection of the new audio source may be provided as a message uniquely identifying the new audio source. Alternatively, or in addition, other parameters, and/or the audio signals themselves may be used to determine a new audio source has been selected.

The audio loudness control system may generate a loudness gain value to boost or attenuate the audio signals in real time. Determination of the loudness gain value may be based on parameters associated with the audio signal. In one example, loudness gain values generated by the audio loudness control system for selected audio sources may be stored in a loudness database. Upon selecting a previously selected audio source, the corresponding loudness gain value may be retrieved from the loudness database and a corresponding loudness gain value may be applied to the audio signal.

One aspect of the audio loudness control system is that it can make use of appropriate messages present on a network to identify the audio source. In the example of a vehicle network, such as a vehicle eMOST bus, the audio loudness control system may use messages retrieved from the eMOST bus to help guide its performance. As a result, the audio loudness control system may adjust the loudness of the signal at times when it is necessary. In addition, the audio loudness control system can learn the listening habits of a user and retain this information each time it is used. This allows the audio loudness control system to make certain predictions that enable it to make smoother transitions between audio sources.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
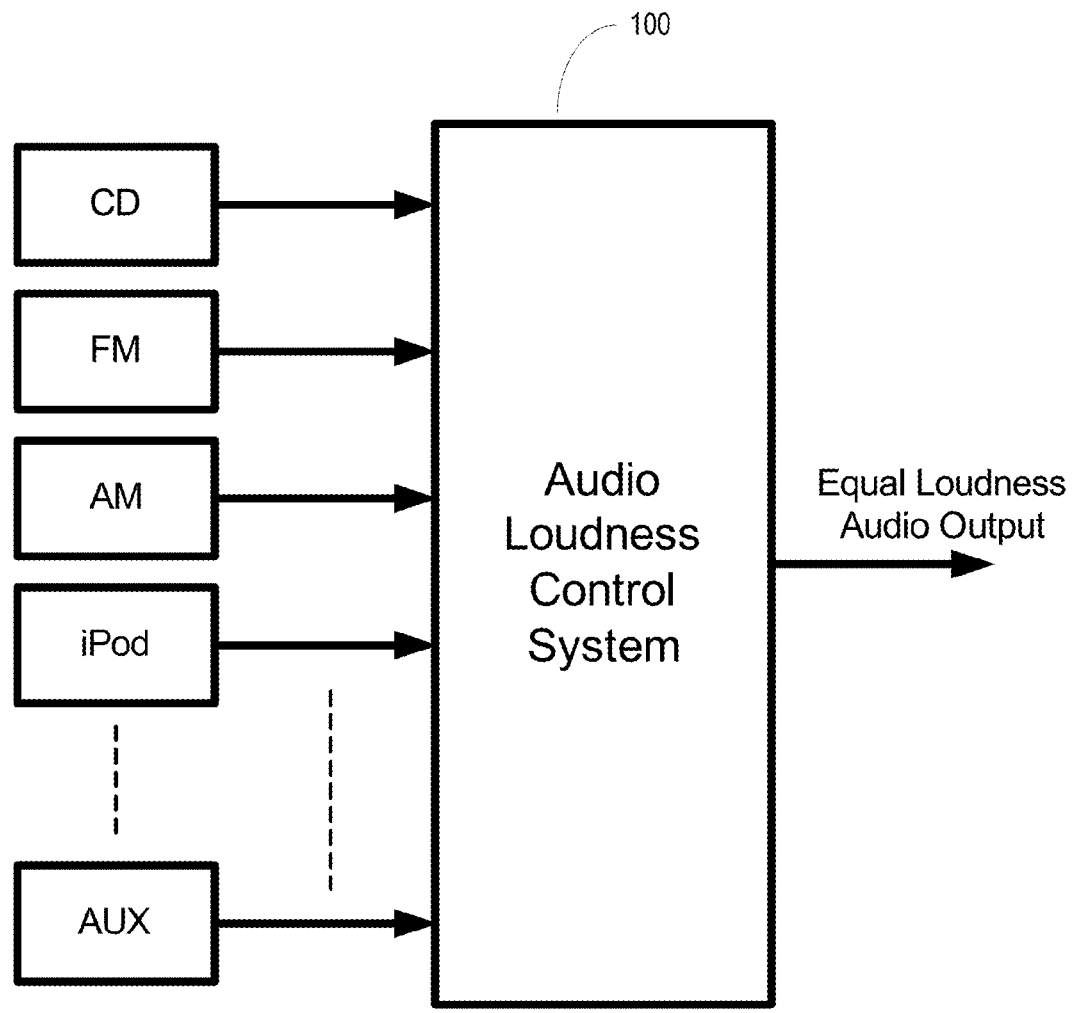
FIG. 1 is a block diagram of an example audio system that includes an audio loudness control system.

FIG. 1 is a block diagram example of an audio system that includes the audio loudness control system 100. An audio system can typically receive inputs from a variety of audio sources. Examples of the different possible sources include a CD player, AM tuner, FM tuner, satellite radio, Bluetooth, a USB port, iPod, an AUX (auxiliary) input or any other source of audio signals. In addition, possible audio sources may include different channels of audio content, such as radio stations, television channels, internet websites, or any other source of audio content. In many situations the loudness of the audio signals produced by these different audio sources may be very different. As a result, the listener may often find it necessary to adjust the volume control on the audio system as he switches between the different audio sources. The audio loudness control system may automatically reduce the perceived differences in loudness as the listener switches between audio sources so that the user does not have to make frequent adjustments to the volume control.

Figure 2:
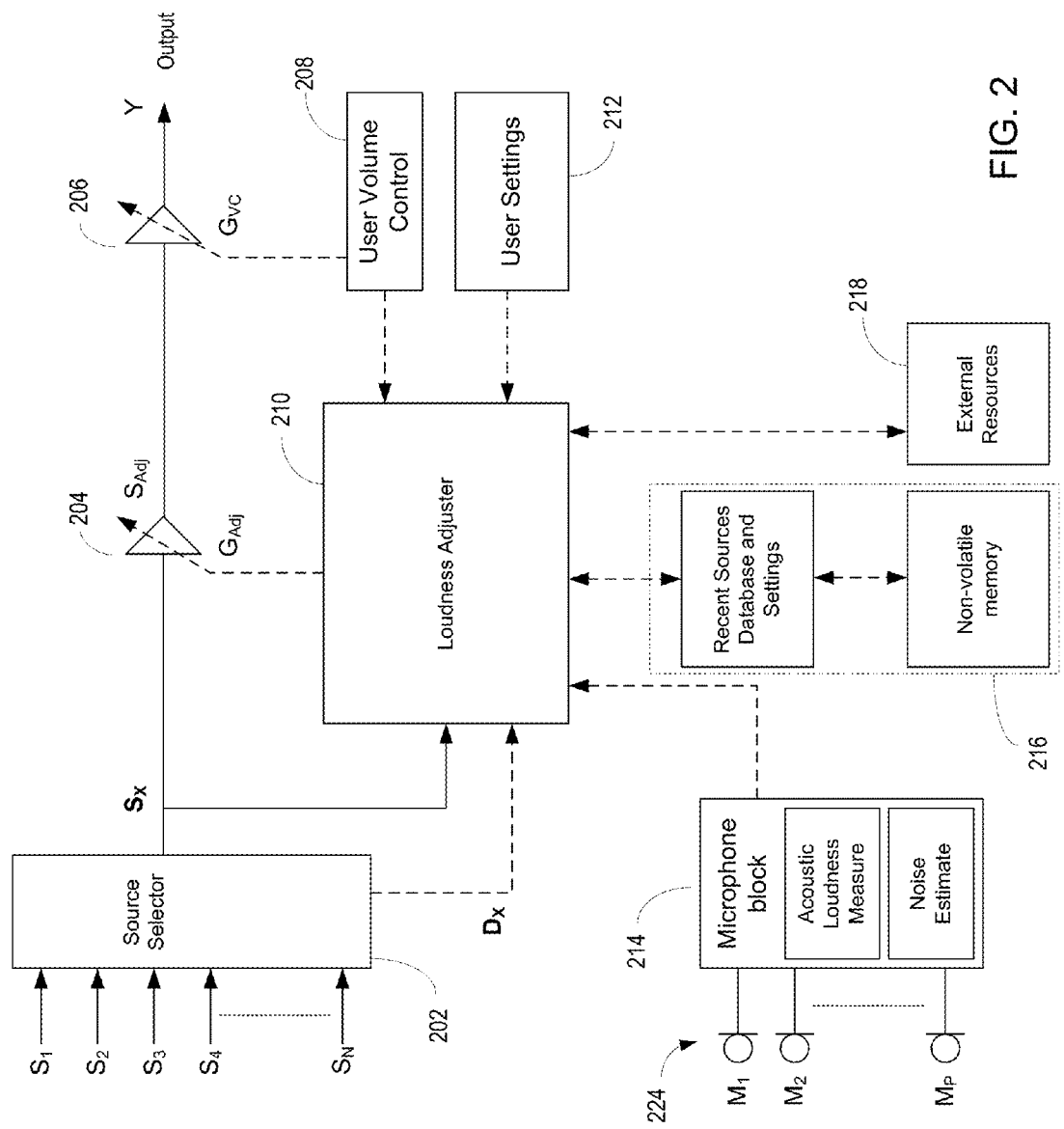
FIG. 2 is a block diagram of an example audio loudness control system.

FIG. 2 is a block diagram of an example of the audio loudness control system. In other examples, additional or fewer modules may be used to describe the functionality of the audio loudness control system. Moreover, the illustrated modules may be independent, or may be sub modules that are formed in any of various combinations to create modules.

In FIG. 2, the audio sources ($S_1$ through $S_N$) may provide audio signals to a source selector module 202. The source selector module 202 may be included in a head unit in a car, a home stereo receiver, such as a HARMAN KARDON AVR, a broadcast studio selector, a channel selector on a radio or television, a computer, or any other mechanism or system capable of selecting between different sources of audio content. The source selector module 202 may operate to select one of the audio sources ($S_1$ through $S_N$), and provide the audio signal (Sx) of the selected audio source as an output signal. As used herein, the term audio signal may refer to either an electrical signal representative of audio content, or an audible sound, unless described otherwise.

The audio signal (Sx) may be processed by a loudness gain adjustment module 204. The gain adjustment module 204 may have an adjustable gain setting that allows loudness adjustment, by attenuation, boost, or pass through of the audio signal (Sx). As described later, dynamic gain adjustment of the loudness gain adjustment module 204 may be based on parameters associated with the audio signal. The loudness adjusted audio signal (Sadj) may be further processed by a volume gain adjust control 206, which is controlled by a volume gain control signal (Gvc) provided by a user volume control 208. The output of the volume gain adjust control 206 may be provided as an audio output signal to drive a loudspeaker. The user volume control 208 may be a manually operated user control of the volume of audible sound produced.

The selected source audio signal (Sx) is also provided as an input to a loudness adjuster module 210. The loudness adjuster module 210 may also receive a volume setting indication from the user volume control 208, user settings from a user setting module 212, and a message Dx from the source selector 202.

The message Dx may be an indicator of the identity of the audio source ($S_1$ through $S_N$) providing the audio signal (Sx). The message Dx may be included with the audio signal (Sx), such as side chain data. Alternatively, the message may be a separate message provided by either the audio source ($S_1$ through $S_N$), or the source selector 202, or any other message generation device or system with knowledge of the identity of the audio source ($S_1$ through $S_N$).

The loudness adjuster module 210 may perform loudness analysis and control the loudness gain adjustment module 204. In one example, the trigger for performance of the loudness analysis may be based the audio signal (Sx). A gain adjust signal (Gadj) may be dynamically generated with the loudness adjuster module 210 to adjust the level of the audio signal (Sx). The loudness adjuster 210 may determine a timing of application of a dynamically adjust signal based on the parameters. The loudness adjuster module 210 may take into account many different parameters when determining not only if any adjustment is needed, but also the timing for making such loudness adjustments. The loudness adjuster module 210 may adjust the loudness as the source of the audio signal changes, as the audio signal itself changes, and/or as any other situations occur in which the energy level of the audio signal is perceived by the listener as changing. Such loudness adjustments may be based on the message Dx and/or any other parameters received by the loudness adjuster module 210.

For example, in addition or alternatively to the message Dx, the audio signal Sx, the user volume control settings, and/or user settings, the loudness adjuster module 210 may also receive parameter information from a microphone module 214, a database module 216, and an external resources module 218. Such parameter information may be used by the loudness adjuster module 210 to generate the gain adjust signal (Gadj). The database module 216 may be included as part of the loudness adjuster module 210, or may be outside of loudness adjuster module 210, or a combination of both.

The microphone module 214 may measure loudness acoustically. In addition, ambient noise, such as noise in a vehicle may also be measured. The microphone module 214 may also identify sources of noise based on frequency of the audio signal, database information indicating available noise sources, and/or detecting noise among the signal, such as based on determination of a noise floor estimate.

The microphone module 214 may receive audio signal inputs from one or more microphones 224. The audio signal inputs may be used to perform an acoustic loudness measurement and a noise estimate. Such actual loudness information may be used to confirm analysis based on parameters received via other sources, or may be used in lieu of such other parameters. Since the microphone module 214 may provide actual loudness in the listening space, or even at one or more listening positions, the loudness adjuster module 210 may more accurately adjust the loudness gain adjust signal (Gadj). Accordingly, the microphone block module 214 may provide a closed loop control that may be used by the loudness adjuster module 210 to adjust the loudness.

The loudness database 216 may provide storage of parameters in the form of previous loudness settings determined by the loudness adjuster 210 for at least some of the audio sources ($S_1$ through $S_N$). Alternatively, or in addition, parameters that may be used by the loudness adjuster module 210 to determine loudness settings, or modify loudness settings may be stored in the database and extracted. Accordingly, upon determination that one of the audio sources ($S_1$ through $S_N$) will begin providing the audio signal (Sx), the loudness adjuster module 210 may extract one or more parameters from the loudness database 216 and perform loudness analysis. In some example, adjustments to the loudness gain adjust signal (Gadj) may be performed by the loudness adjuster module 210 so that loudness gain adjustment is already applied to the audio signal (Sx) when first provided as audible sound. Thus, a listener will not experience a change in loudness after the audio signal (Sx) begins driving a loudspeaker.

The parameters stored in the loudness database 216 may be from recently selected sources, and may be removed after a predetermined period of time to avoid using out dated settings. Alternatively, or in addition, only some, or none of the parameters may be removed after a determined period of time. Parameters stored in the loudness database 216 may also include user settings, characteristics and/or operational parameters that are stored in association with an identifier of the audio sources ($S_1$ through $S_N$). An example user setting would be a mode of operation set by a user for a particular audio source. An example characteristic could be different modes of operation of the loudspeaker adjuster module, and an example operation parameter could be the use of different settings dependent on other operational parameters such as the user volume control setting.

The parameters may be stored in the loudness database 216 in non-volatile memory so that power down of the system does not cause loss of data. This could be important in a vehicle application where the system will likely regularly be powered off and back on.

The external resources module 218 may be any external source providing other indications to the loudness adjuster module 210 that the audio source has changed or that the content of the audio source has changed. For example, characteristics of the audio signal may be analyzed by an external source and provided to trigger loudness analysis and/or adjustment. Characteristics such as an audio signal changing between mono and stereo, a mid to side ratio of an audio signal, a change in the noise floor of an audio signal, speech detection, music detection, a change in key or pitch of a song, a change in tempo of a song, or any other event that could indicate that the audio source has changed or that the content of the audio source has changed. In addition, audio signal fingerprinting, or any other information indicative of a change in user perceived energy of an audio signal could be provided to the loudness adjuster 210 via the external resources module 218 for use in triggering and/or assisting with loudness analysis. Accordingly, the external resources module 218 may supplement or replace the message Dx with a hybrid message from which conclusions may be drawn with respect loudness control by the loudness adjuster module 210.

Figure 3:
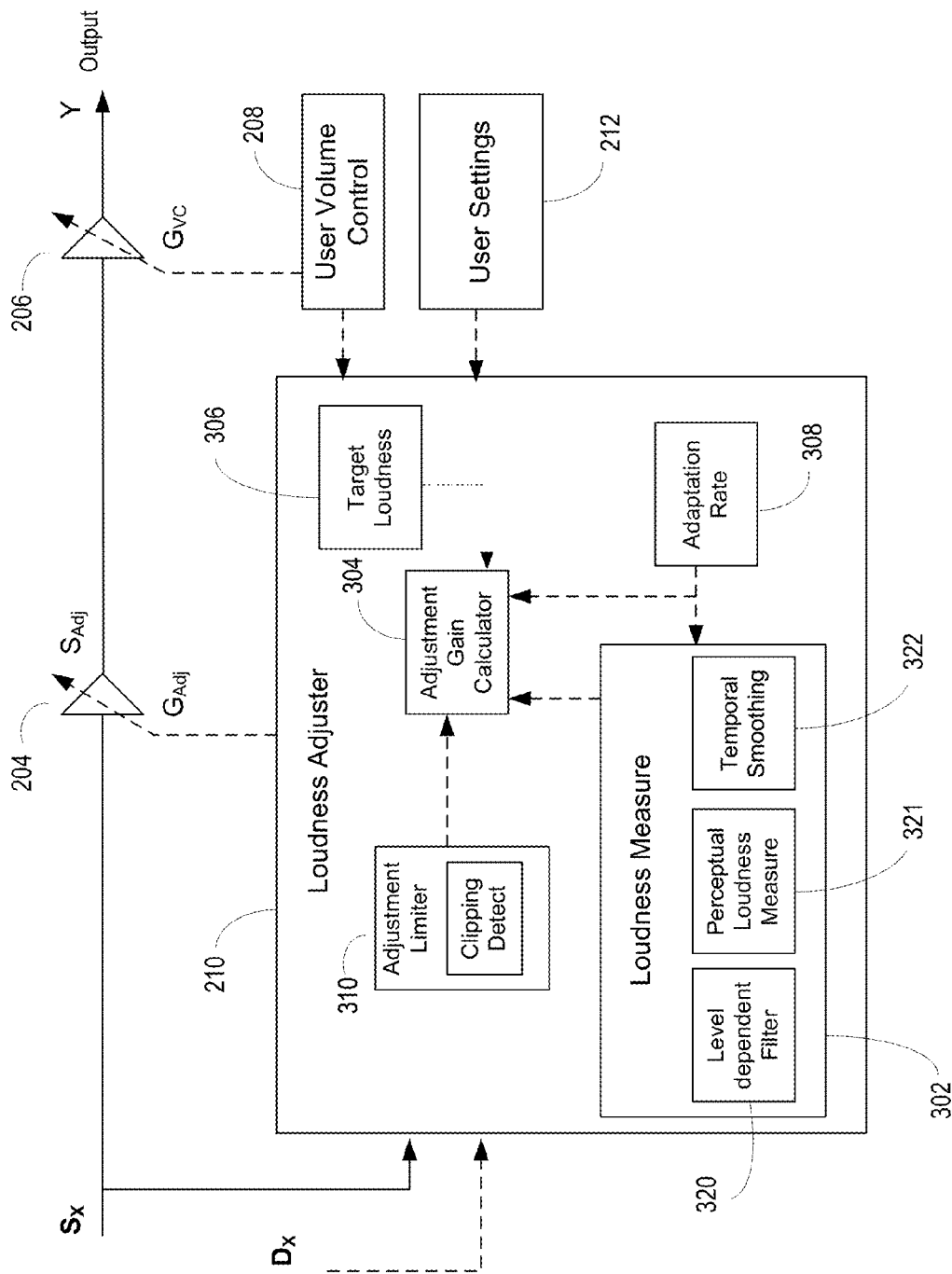
FIG. 3 is a block diagram that includes an example of a loudness adjuster.

FIG. 3 is a block diagram of a more detailed example of the loudness adjuster module 210 that also illustrates the loudness gain adjust module 204, the volume gain adjust module 206, the user volume control module 208, and the user setting module 212. In FIG. 3, the loudness adjuster module 210 includes a loudness measure module 302, an adjustment gain calculator module 304, target loudness module 306, an adaptation rate module 308 and an adjustment limiter module 310. In other example, fewer or greater numbers of modules could be included to describe the functionality of the loudness adjuster module 210.

The audio signal (Sx) may be provided to the loudness measure module 302 which may be employed to derive a measured loudness value (L1) The loudness measure module 302 may consist of a level dependent filter 320, a perceptual loudness measure module 321, and a temporal smoothing module 322. The sensitivity of the human auditory system to different frequencies is dependent upon the level at which the sound is heard. Generally speaking, lower frequency sounds and higher frequency sounds are significantly less audible relative to mid frequency sounds when these sounds are reproduced at quiet levels. When these sounds are reproduced at louder levels the differences in the audibility of different frequencies may be greatly reduced. As a result, the differences in the perceived loudness of different signals varies with the level at which the signals are reproduced. The level dependent filter 320 may be used to account for the level dependent sensitivity of the human auditory system by altering its characteristics in response to the setting of the user volume control 208. The level dependent filter 320 may also alter its response based on level information received from the microphone module 214. The perceptual loudness measure module 321 provides a measure of the loudness of a signal over a period of time. The perceptual loudness measure module 321 may receive the level dependent filtered signal (Rx) as its input and it may provide a single value (P1) representing the loudness of the signal over a period of time. For example, the perceptual loudness measure 321 may consist of a simple root-mean-squared measure of the signal. Alternatively, the perceptual loudness measure 321 may consist of a weighted root-mean-squared measure such as the one described in the international standard Recommendation ITU-R BS.1770-2, or any other method that provides a measure of the perceived loudness of a signal over a period of time.

Figure 4:
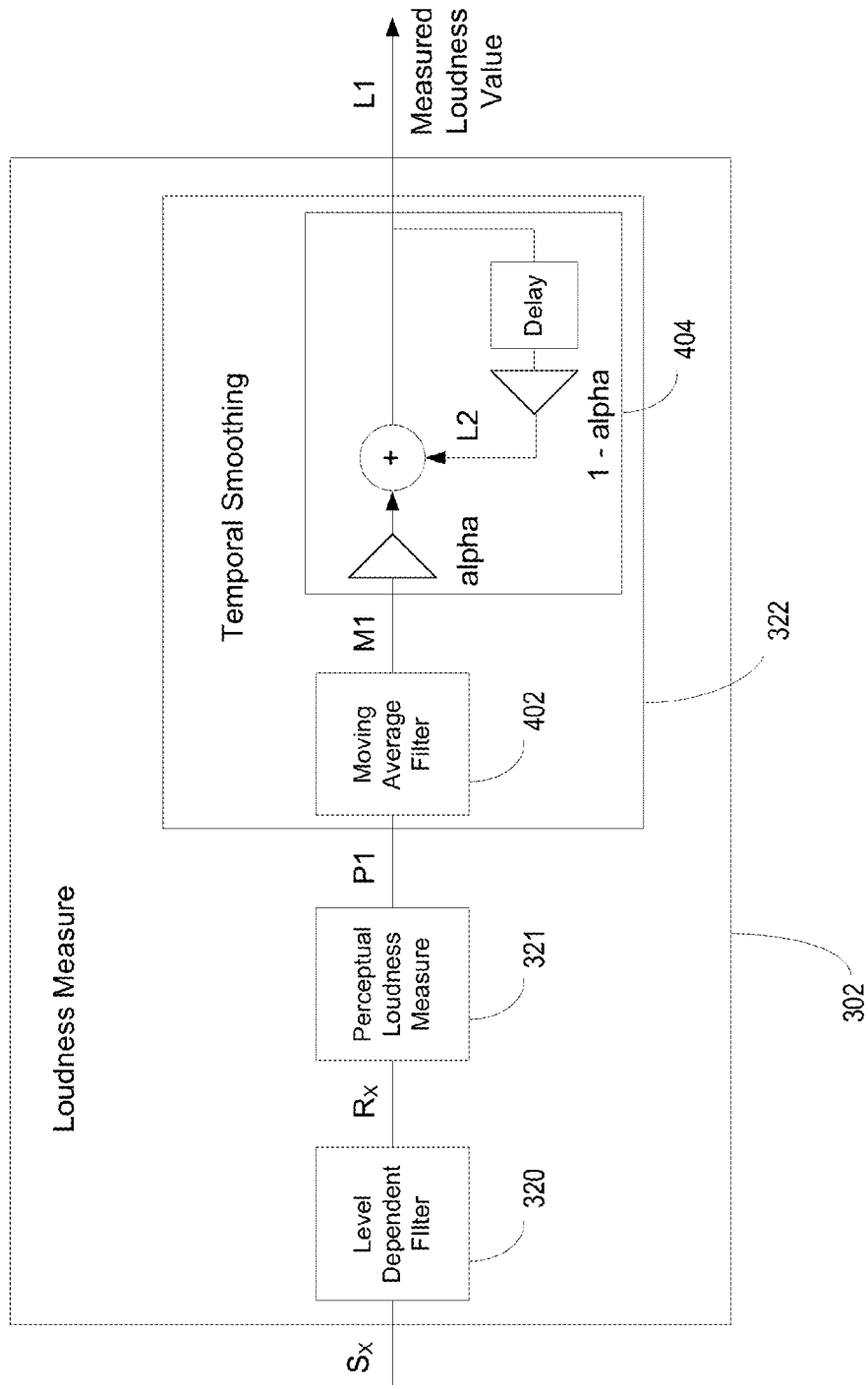
FIG. 4 is a block diagram of an example loudness measure module included in the loudness adjuster.

The single value output (P1) of the perceptual loudness measure module 321 may be provided to a temporal smoothing module 322. FIG. 4 is an example block diagram illustrating additional detail of the loudness measure module 302. In FIG. 4, the temporal smoothing module 322 may smooth the (P1) values over time in order to mimic the manner in which the human auditory system tends to perceive the overall loudness of a fluctuating audio signal. The temporal smoothing module 322 provides a measured loudness value (L1) which is a value that represents the perceived loudness of the audio signal (Sx) over a period of time. The temporal smoothing module 322 may include a combination of a moving average filter 402 and an IIR (infinite impulse response) filter 404. The rate of smoothing may be varied by varying the value of alpha which determines both the gains of the feed-forward and feed-back components of the IIR filter 404, with smaller values of alpha providing more smoothing. The measured loudness value (L1) may be provided to the adjustment gain calculator module 304 for use in deriving the gain adjust value (Gadj).

The adjustment gain calculator module 304 determines whether to boost, attenuate or take no action to change the loudness of the audio signal (Sx). The adjustment gain calculator module 304 may compare the measured loudness value (L1) determined by the loudness measure module 302 to a Target Loudness value provided by the target loudness module 306. The target loudness module 306 may determine the Target Loudness value based on the message Dx for the audio signal (Sx), the audio signal (Sx), or any other parameters related to the selected audio signal (Sx). Alternatively, or in addition, the Target Loudness may be stored in the loudness database in association with the audio source identifier, and the target loudness module 306 may retrieve the stored Target Loudness. Alternatively, or in addition, the Target Loudness may be adjusted by the target loudness module 306 based on the user settings provided in the user settings module 212.

Alternatively, or in addition, the Target Loudness may be adjusted by the target loudness module 306 based on the volume setting provided by the user volume control module 208. The user volume level of an audio signal has an effect on the loudness. At lower user volume settings, the middle range of frequencies, such as from about 500 Hz to about 3000 Hz may be perceived as including more energy than the higher and lower frequency ranges. Thus, the target loudness module 306 may provide boost or attenuation of the audio signal (Sx) only in certain ranges of frequency, and/or in view of the perceived energy levels. If, on the other hand, the user volume setting is relatively high, the loudness energy is perceived as relatively uniform, and the target loudness module 306 may set/adjust the Target Loudness accordingly in view of the relatively high volume setting.

The adjustment gain calculator module 304 may generate the gain adjust value (Gadj) that controls the loudness gain adjust module 204. Generation of the gain adjust value (Gadj) may be based on comparison of the measured loudness to the Target Loudness. Accordingly, as differences between corresponding frequencies of the measured loudness and the Target Loudness are identified by the adjustment gain calculator module 304, a corresponding gain adjust value for the identified range(s) of frequencies may be generated. For example, a measured loudness and the Target Loudness may be substantially the same between 500 Hz and 3000 Hz, and substantially different between 0 Hz and 499 Hz and/or between 3001 Hz and 20,000 Hz. Differences between the measured loudness and the Target Loudness at a given frequency, or frequency range, may be identified by the adjustment gain calculator module 304 based on an energy difference threshold. The energy difference threshold may be a predetermined threshold value such that measured loudness that is different from the Target Loudness by more than the energy difference threshold may trigger generation of the gain adjust value (Gadj). Alternatively, or in addition, the energy threshold value may be created and/or varied by the adjustment gain calculator module 304 based on parameters received by and/or determined by the loudness adjuster module 210. For example, the energy threshold value may be a predetermined value for a give frequency that is variable increased as a volume level is increased, since at higher volume levels greater differences in loudness are less likely to be perceived by a listener. During generation of the gain adjust value (Gadj), the adjustment gain calculator module 304 may receive inputs from the adaptation rate module 308 and an adjustment limiter module 310 and selectively further adjust the generated gain adjust value (Gadj).

The adaptation rate module 308 determines the adaptation rate or rate of change of the gain adjust value (Gadj). The adaptation rate module 308 may review the measured loudness value and the Target Loudness value and adjust the gain adjust value (Gadj) generated by the adjustment gain calculator module 304 so that changes to the loudness of the audio signal transition at a predetermined rate of change. As discussed later, operation of the adaptation rate module 308 may be suspended during instances where quick changes in loudness of the audio signal (Sx) are desired, such as during the initial period of Selective Adjust Mode.

The adjustment limiter module 310 may confirm that the gain adjust value (Gadj) generated by the adjustment gain calculator module 304 does not exceed predetermined limits. As discussed later, the audio loudness control system 210 may include settings for a maximum boost and maximum attenuation of the energy level of the audio signal (Sx). In addition, the adjustment limiter module 310 may include clip detection to confirm that the generated gain adjust value (Gadj) will not result in clipping of the audio output signal. Clip detection and limit checking by the adjustment limiter module 310 may be ongoing during operation. In addition, the adjustment limiter module 310 may dynamically direct adjustment of the gain adjust value (Gadj) by the adjustment gain calculator module 304 when the gain adjust value is outside of the boost or attenuation limit, or when a clipping event is anticipated by the adjustment limiter module 310.

The audio loudness control system may include a number of different operational modes and settings that can be selected/adjusted to customize the performance of the system. An example of parameters includes:

| Name: | Range of values: | Default value: |
| --- | --- | --- |
| Audio Loudness Control: | Off/On [0/1] [Bypass/Active] | 1 [On] |
| Message Mode: | Off/On [0/1] | 1 [On] |
| Selective Adjust Mode: | Off/On [0/1] | 1 [On] |
| Continuous Adjust Mode: | Off/On [0/1] | 0 [Off] |
| Second Chance: | Off/On [0/1] | 1 [On] |
| Speech Detect: | Off/On [0/1] | 0 [Off] |
| ReAnalyze: | Off/On [0/1] | 0 [Off] |
| dBOffset: | +/−6 dB in 0.5 dB steps | 0.0 |
| Max Boost: | 0 to 30 dB (in 1 dB steps) | 15.0 |
| Max Cut: | 0 to 30 dB (in 1 dB steps) | 20.0 |

Audio Loudness Control—On/Off—This may be a User Parameter that allows the user to switch the audio loudness control system on and off. When the audio loudness control system is switched to off it is entirely removed from the audio signal path. As a result, the audio loudness control system 210 has no effect on the audio signal when it set to off.

Message Mode—One mechanism for optimizing performance is for the audio loudness control system 210 to monitor a network for Dx messages. Example networks include home networks, vehicle networks, or any other network where audio sources may be communicating. In one example, the audio loudness control system 210 may monitor a MOST bus in a vehicle for eMOST bus messages from the head unit and look for audio related messages that can help guide how the audio loudness control system operates. In this case the audio loudness control system 210 may be set to operate in $FULL_{13}$ MESSAGE mode in order to monitor for, receive and process audio-related network messages. When the network message mode is disabled or unavailable, the audio loudness control system 210 may be set to operate in DIRECT_MESSAGE mode. In the DIRECT_MESSAGE mode, the audio loudness control system 210 may receive messages from the source selector 202, or from the audio sources, as previously discussed. The Message Mode can be set at the time of tuning the audio loudness control system 210. In some example configurations, once this mode is set at the time of tuning it cannot be changed.

Adjust Mode—the audio loudness control system 210 can be set to use one of two or more modes when making decisions about how to adjust the level (and therefore loudness) of a signal. Some of the modes include a Selective Adjust Mode and a Continuous Adjust mode.

For each audio source (e.g., FM tuner, AM tuner, CD, AUX, etc.) the audio loudness control system 210 can be set to operate, for example, in either Selective Adjust Mode and a Continuous Adjust mode. The adjust mode can be set for each audio source, such as at the time of tuning. These settings can remain fixed after the tuning process.

In some examples, a Flag may also be associated with each of the audio sources. This Flag can indicate to the audio loudness control system 210 how to behave for that particular audio source. In particular, the Flag can tell the audio loudness control system 210 whether or not to operate in Selective Adjust Mode, or Continuous Adjust Mode. A separate Selective/Continuous Adjust Flag may be associated with each of the audio sources.

Figure 5:
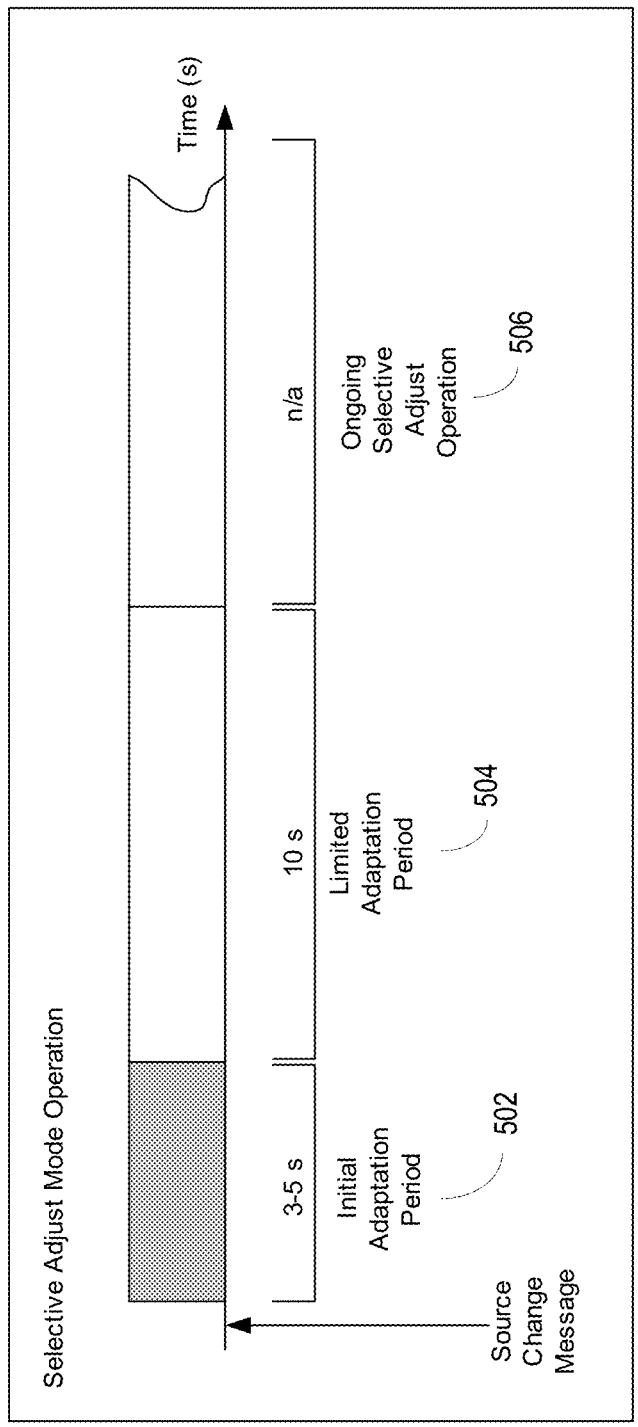
FIG. 5 is timing diagram for example operation in a selective adjust mode.

Selective Adjust Mode: In Selective Adjust Mode the audio loudness control system 210 selectively adjusts the loudness of a signal when there is a change in the audio source or audio content. In some examples, such selective adjustments may occur when there is a change in the audio source or audio content. One example of a change of audio source is when the listener switches from AM tuner to a CD. Another example is when the listener switches stations on the FM tuner. In both of these cases the user has initiated a change in the audio source which may result in a change in loudness. Therefore, as illustrated in FIG. 5, for an initial adaptation period 502, which may be a short period of time, such as three to five seconds after the audio source has changed, the audio loudness control system 210 can adjust the loudness of the signal as needed until the initial adaptation period 502 elapses. The loudness adjuster module 210 may determine a timing of performance for an adjustment of a loudness level of the audio signal as being within the initial adaption period 502 that begins upon initial receipt of the audio signal and end after a determined window of time has elapsed. Adjustment of the loudness of the audio signal during the initial adaptation period 502 may be a first loudness adaptation rate associated with the gain adjust value. When a change of audio source or audio content occurs, it is possible that there may be very large differences in the loudness of the audio sources. Such large differences in loudness may be disturbing to the listener. For example, if the new audio source is much louder than the old audio source, then this sudden increase in loudness may be jarring to the listener. To address this, during the initial adaptation period 502, the audio loudness control system 210 may be allowed to have a very fast rate of adaptation, and may be allowed to make large adjustments. During the initial adaptation period 502, the adjustment of the loudness of the audio signal may be readily audible to the listener. The duration of the initial adaptation period 502 may be sufficiently long enough to fully compensate for any large loudness differences that may exist between the old audio source or audio content and the new audio source or audio content. Once this adjustment is complete due to the period of time expiring, the audio loudness control system 210 can refrain from making any further quick loudness adjustments, such as by freezing the loudness gain adjustment module 204 during a limited adaptation period 504.

During the limited adaptation period 504, changes in the loudness of the audio signal may occur at a second loudness adaptation rate associated with the gain adjust value. The second loudness adaptation rate may include significantly slower and/or include significantly fewer adjustments of the loudness of the audio signal such that the loudness remains substantially unchanged as perceived by a listener. In one example, during the limited adaptation period 504, the second loudness adaptation rate may make no changes to the loudness, and the loudness gain adjust signal (Gadj) may remain unchanged. In another example, at the second loudness adaptation rate, only very small changes can be made over extended periods of time, such as less than 1 dB (decibel) of change over a period of two or three minutes. During the limited adaptation period 504, the adaptation rate may be slow enough that the listener is not readily aware, or able to perceive, of any adjustment of the loudness of the audio signal that may be made by the audio loudness control system 210 The duration of the limited adaptation period 504 may be long enough for the audio loudness control system 210 to make an accurate measure of the loudness of the audio signal, while not being too long such that the user feels the need to make a manual change to the loudness of the signal Following completion of the limited adaptation period 504, the audio loudness control system 210 can selectively adjust the loudness of the signal at a third predetermined rate indicated as an ongoing selective adjust period 506. During the ongoing selective adjust period 506, the loudness of the audio signal may be adjusted at a rate that is less than the initial adaptation period 502, and greater than the limited adaptation period 504. As such, the audio loudness control system 210 may make loudness adjustments slowly over an extended period of time. At the first adaptation rate, on the other hand, loudness adjustments may occur more frequently in a shorter period of time. In an example, at the third adaptation rate the loudness control system 210 may allow adjustments of 1-5 dB (decibels) over a period of a minute or more. At this rate, small changes in loudness may sometimes be noticed by the listener as they are being made. The rate of adaptation during the ongoing selective adjust period 506 can be slower than a rate where the natural loudness dynamics of the audio signal are perceived by a listener as being altered. Alternatively, in other examples, the ongoing selective adjust period 506 may be omitted, the loudness gain adjust signal (Gadj) may remain frozen.

Thus, as illustrated in FIG. 5, if for example an audio signal received from an audio source experiences a significant change in loudness after the initial adaptation period 502 has concluded and the limited adaptation period 504 has commenced, such as more than five seconds after switching to that audio source or changing content of an audio source, the audio loudness control system may take no action. This avoids the case where the audio content is by design of the artist supposed to include significant changes in energy level. As a result, when operating in Selective Adjust Mode, the audio loudness control system 210 can have the least effect possible on the audio signal while still addressing loudness differences. In an example, Selective Adjust Mode can be selected when messages are available from the head unit, amplifier or any other component of the system. Therefore, the audio loudness control system 210 can operate in Selective Adjust Mode when it is set to operate in FULL_MESSAGE mode.

Figure 6:
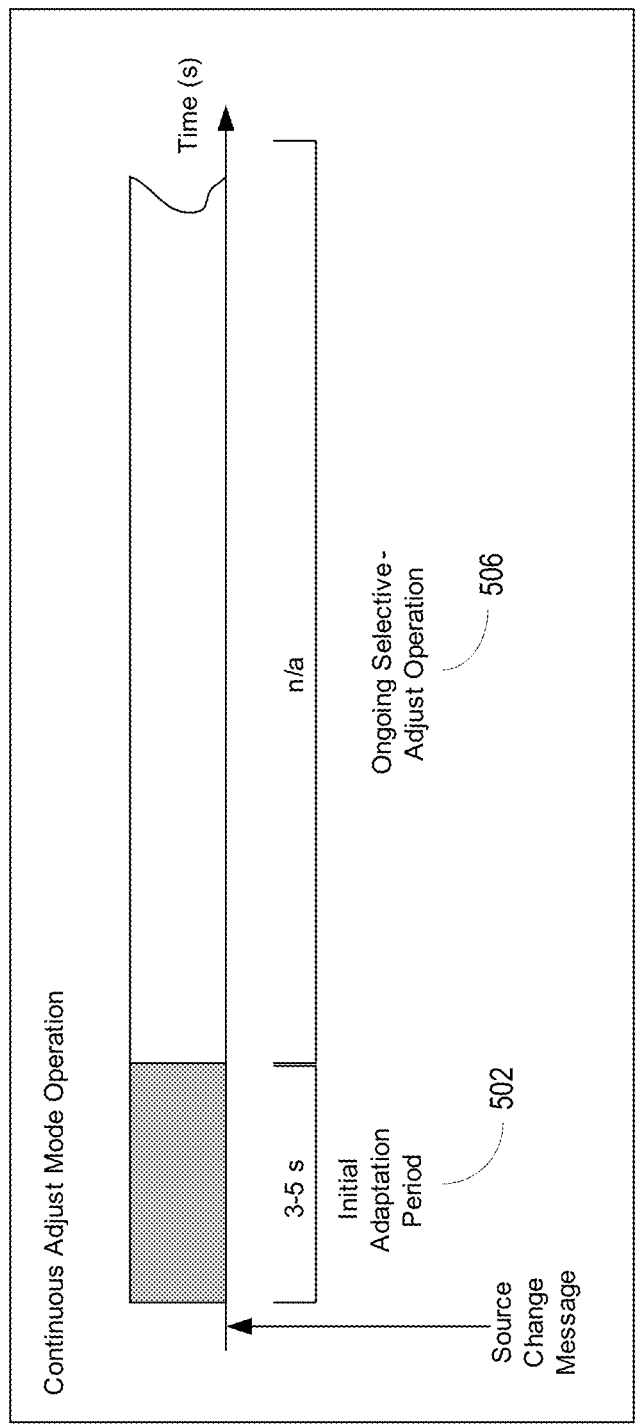
FIG. 6 is timing diagram for example operation in a continuous adjust mode.
Figure 7:
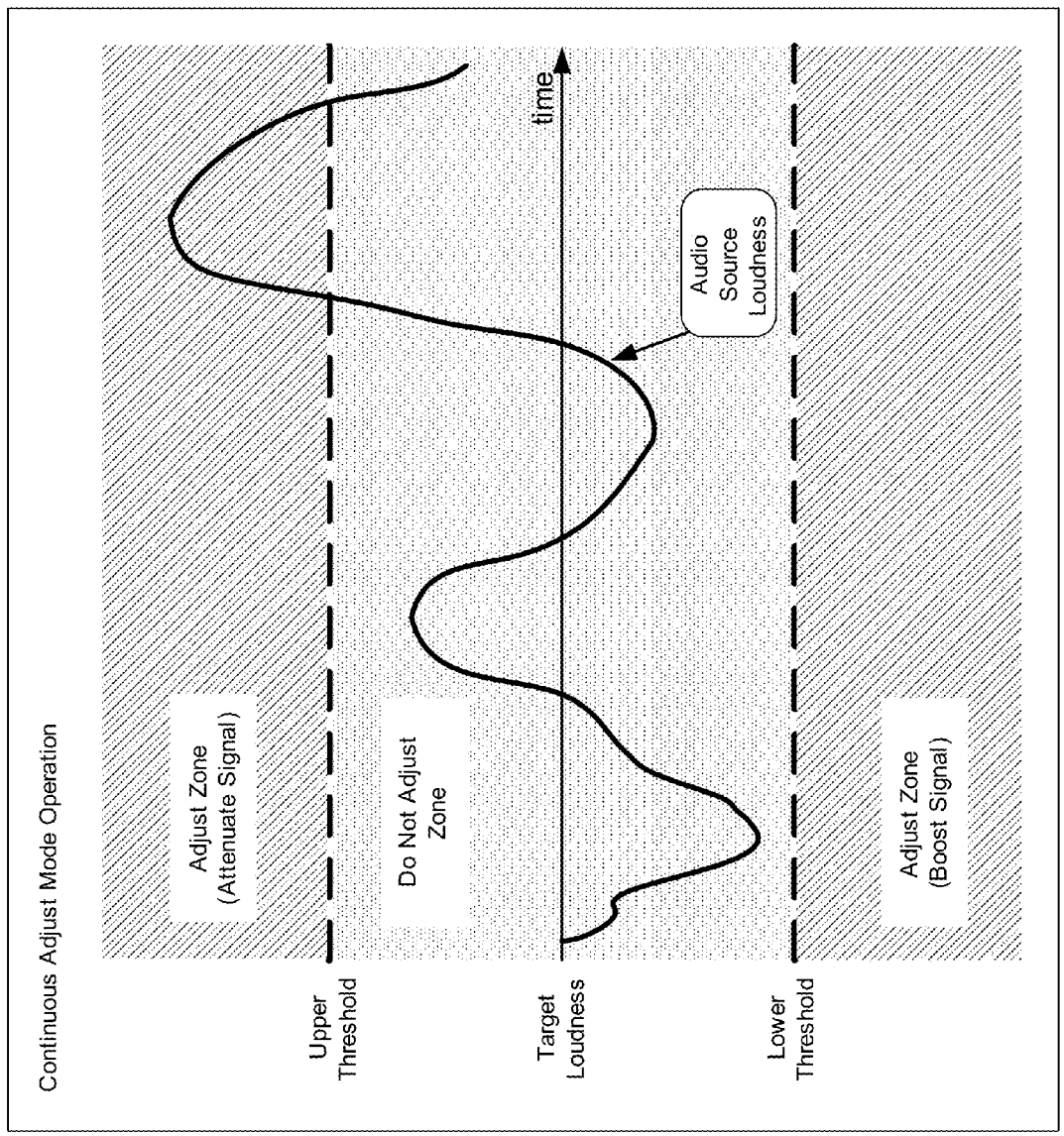
FIG. 7 is an example of continuous adjust mode operation.

Continuous Adjust Mode: In Continuous Adjust mode the audio loudness control system 210 can continue to adjust the loudness of the signal after a change in the audio signal, such as a change in the content of the audio signal or change in the audio source has occurred. In addition, the audio loudness control system 210 can allow larger adjustments to the loudness to be made during an initial window of time, such as substantially immediately following a change in the audio source during the initial adaptation period 502. In the example illustrated in FIG. 6, the initial adaptation period 502 window of time may be within the first three to five seconds of selecting the new audio source or changing the audio source. Following initial loudness adjustments, after the initial window of time has elapsed, the audio loudness control system 210 can provide smaller adjustments of the loudness gain adjust signal (Gadj) made on a substantially continuous or as needed basis by monitoring the energy level of the audio signal during the previously discussed ongoing selective adjust period 506. In Continuous Adjust Mode during the ongoing selective adjust period 506, the audio loudness control system 210 can make adjustments if the difference between the current audio source loudness and the Target Loudness is greater than a predetermined threshold as illustrated in FIG. 7.

As a result, when operating in Continuous Adjust mode, the audio loudness control system 210 can tend to have more effect on the audio signal as compared to Selective Adjust Mode. In some examples, Continuous Adjust Mode can be selected when messages are available from the head unit. In these examples, the audio loudness control system 210 can operate in Continuous Adjust Mode when it is set to operate in FULL_MESSAGE mode.

Second Chance Mode—In general, Second Chance Mode enables the audio loudness control system 210 a second opportunity to adjust the energy level of the audio signal (Sx) following the initial changes associated with changing the audio signal, or from one audio source to another during the initial adaptation period 502. Second Chance Mode may be used in the Selective Adjust Mode. In the Selective Adjust Mode, Second Chance Mode is initiated after a predetermined time, such as ten seconds, after adjustments performed when the audio source was first selected are completed and further adjustments in loudness have been frozen during the limited adaptation period 504. Thus, for example, the audio loudness control system 210 may make significant changes in a first period of time, such as the first five seconds, during the initial adaptation period 502, freeze all further adjustments, for a second period of time, such as ten seconds, during the limited adaptation period 504, and then determine if additional adjustments are warranted. Such additional adjustments may be warranted due to, for example, when changing audio sources it is possible that the new source will happen to be at a quiet point in the song. If the audio loudness control system 210 performs its loudness adaptation on a quiet point in the signal it can boost the signal accordingly. If the signal (song) now gets louder the user may perceive the signal to be too loud. Second Chance Mode may be an extension to Selective Adjust mode in order to avoid such over boosting. (Note that such over boosting can be avoided when operating in Continuous Adjust Mode since the audio loudness control system 210 can adjust the gain as needed.) Alternatively, Second Chance Mode may be used with Continuous Adjust Mode to, for example, increase the aggressiveness of loudness changes, and/or allows larger changes in loudness.

Figure 8:
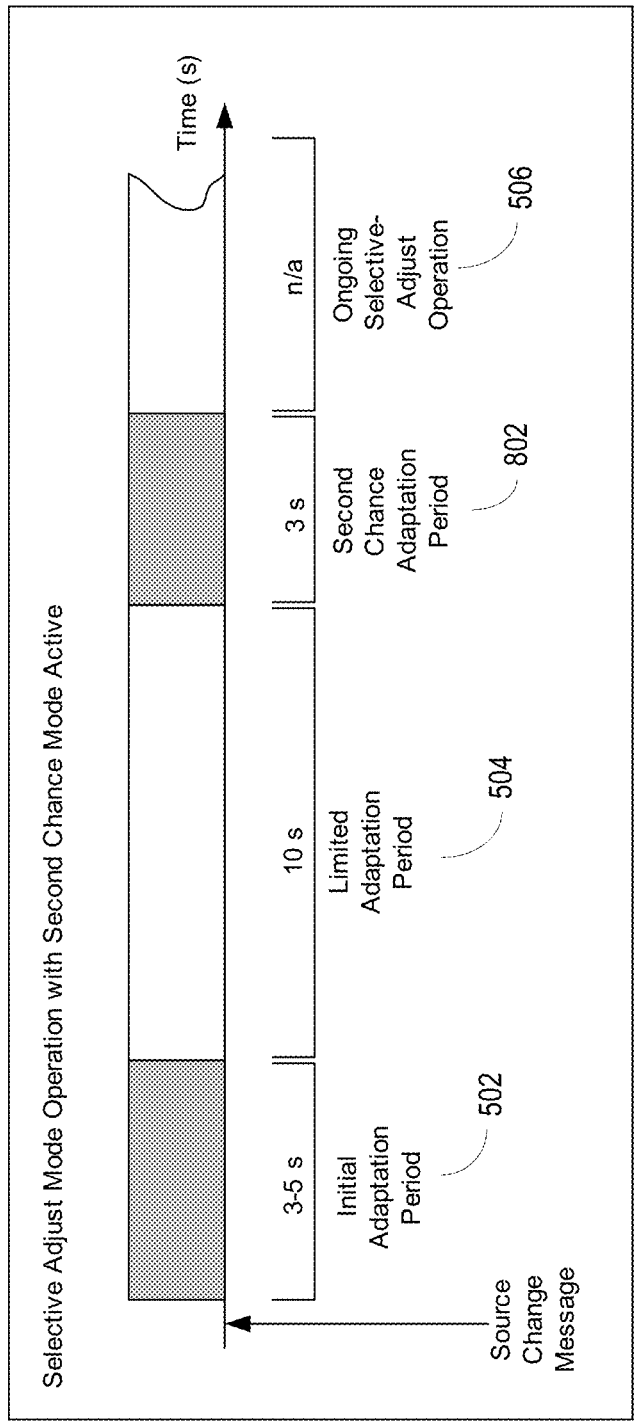
FIG. 8 is timing diagram for example operation in selective adjust mode with second chance mode active.

FIG. 8 illustrates an example operation of the audio loudness control system 210 with Second Chance Mode active during Selective Adjust Mode, in which the following steps may occur:

1) The user changes audio signals or audio sources and an indication is received or determined by the audio loudness control system 210.
2) The audio loudness control system 210 detects a valid signal and performs an initial adaptation over a first predetermined period of time, such as 3 to 5 seconds during the initial adaptation period 502.
3) After the first predetermined period of time has elapsed, the audio loudness control system 210 then "freezes" the adaptation for a second predetermined period of time, such as about 10 seconds during the limited adaptation period 504.
4) If during the second predetermined period there is a significant increase in the loudness of the input signal by a predetermined threshold amount, such as >6 dB of increase, then the audio loudness control system 210 can enable a second chance adaptation period 802. This second adaptation period lasts a third predetermined period of time, such as about 3 seconds. During the second chance adaptation period 802, the loudness gain adjust signal (Gadj) may again be aggressively adjusted during a fourth loudness adaptation rate associated with the gain adjust value, which may be substantially similar to the first loudness adaptation rate that occurs during the initial adaptation period 502. In some example implementations, the second chance adaptation period 802 may be triggered if the audio signal gets significantly louder after the initial adaptation period 502.
5) Following the second chance adaptation period 802, the adaptation rate can be significantly reduced during the ongoing selective-adjust operation period 506. That is the rate of adaptation can be significantly slower relative to the rate of adaption during the first adaptation period 502 and second chance adaptation periods 802. Another audio source change or change in the content of the audio signal can trigger another full adaptation period.

Speech Detector—When Speech Detector Mode is enabled, the audio loudness control system 210 may determine there has been a change in the audio source or a change in the content of the audio source based on detection of speech or music in the audio signal. In some instances, certain types of audio signals can be reliably detected, such as detecting if an audio signal is speech or music. Once an audio signal is detected as being a type of audio signal that can be reliably detected, adjustments to the loudness may correspondingly be performed. Adjustments may be, for example, values stored in the loudness database in association with the identified type. For example, when an audio signal is analyzed and determined to be speech, the loudness can be boosted for reasons of intelligibility by a predetermined stored amount. Alternatively, or in addition, the type of audio signal may be provided to the audio loudness control system 210 as additional information either in the audio signal itself, or in the message (Dx), for example.

Examples include detection of both speech and music in an audio signal could indicate a commercial, and the audio loudness control system 210 may attenuate the audio signal a predetermined amount. In another example, when neither speech nor music is detected, the audio signal could be a dead air radio station, and the audio loudness control system 210 may attenuate the audio signal a predetermined amount, or freeze any changes in the loudness gain (Gadj).

Max Boost—The Max Boost may be a maximum gain increase in the loudness gain (Gadj) adjustment parameter, to avoid changes that are too abrupt. The Max Boost may be used by the Adjustment Limiter. In one example, the Max Boost may be set to 15 dB.

Max Attenuate—The Max Attenuate may be a maximum gain decrease in the loudness gain (Gadj) adjustment parameters, to avoid changes that are too abrupt. The Max Attenuate may be used by the Adjustment Limiter. In one example, the Max Attenuate may be set to 20 dB.

Fixed Source Gains—Fixed Source Gains may be applied to audio sources where assignment of a predetermined fixed gain is appropriate. For example, for each of the audio sources, in addition to an identifier of the audio source, a Fixed Gains, such as +1-10 dB in 0.5 dB steps may also be included in either the Dx message, or the loudness database. In some instances due to their design some audio sources may be much louder or much quieter compared to other audio sources. For example, the signal level from a CD player may be 10 dB louder than the levels from other audio sources. The purpose of the Fixed Gains can be to allow a user or a system engineer to equalize the levels of the various audio sources, such as making a setting at the time of the vehicle tuning. A separate Fixed Gain may be used for each of the audio sources. In one example, the default value of the fixed gain may be 0.0 dB.

Source Bypass Flag—The Source Bypass flag may indicate that no loudness gain is desired. For each audio source (e.g., FM tuner, AM tuner, CD, AUX, etc) the Source Bypass Flag can be set so that and the audio loudness control system 210 is either On or Bypassed for that audio source. For example, it may be desirable to bypass the audio loudness control system 210 during a Bluetooth Hands-free call. The adjustment mode may be set for each audio source, such as at the time of tuning. These settings can remain fixed after the tuning process.

The audio loudness control system may be or may include a portion or all of one or more computing devices of various kinds, such as a head unit in a vehicle, a home receiver (such as a HARMAN KARDON AVR), a television, a set top box, or any other audio related device that includes a computing system.

Figure 9:
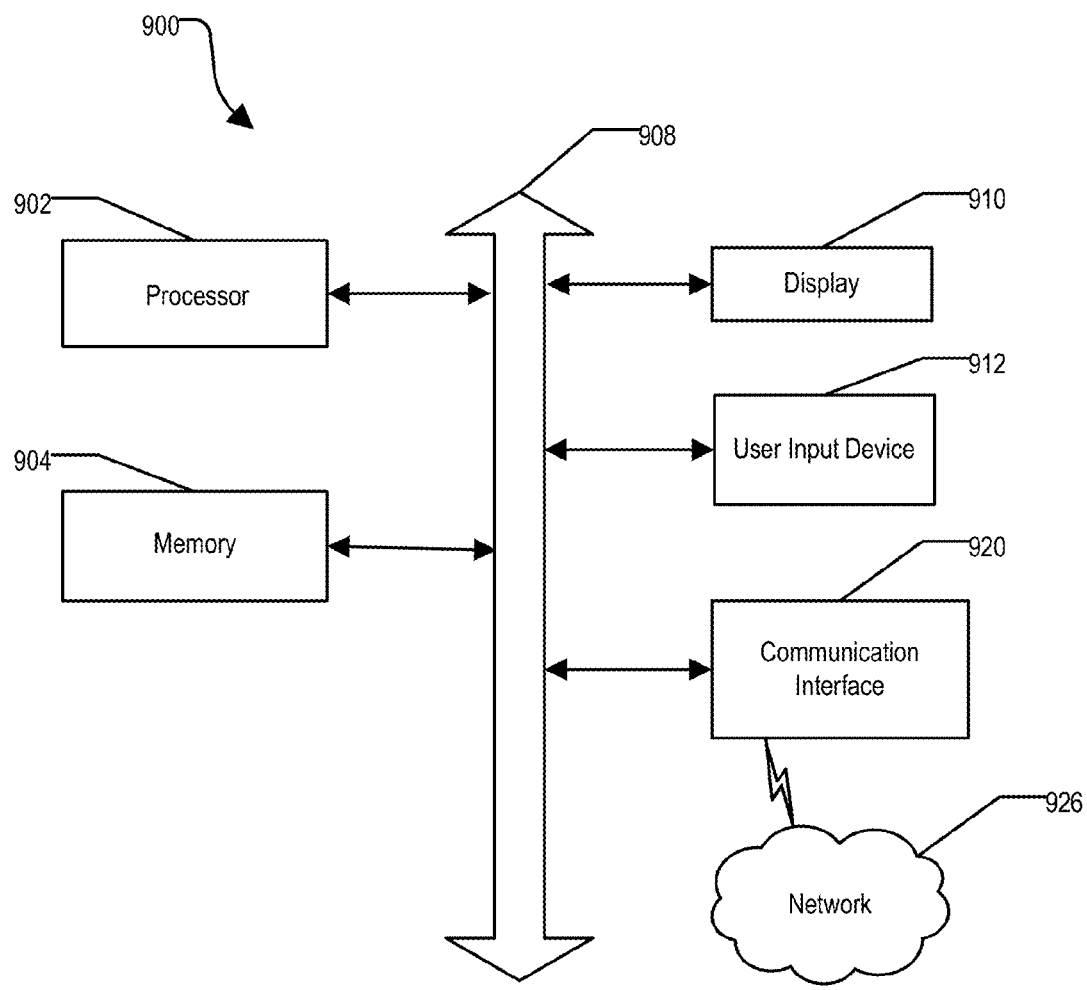
FIG. 9 is an example computing system.

FIG. 9 is an example computing system 900. The computer system 900 may include a set of instructions that can be executed to cause the computer system 900 to perform any one or more of the methods or computer based functions described. The computer system 900 may operate as a standalone device, may be part of another device, or may be connected, such as using a network, to other computer systems or peripheral devices.

In a networked deployment, the computer system 900 may operate in the capacity of a server or as a client user computer in a server-client user network environment, as a peer computer system in a peer-to-peer (or distributed) network environment, or in various other ways. The computer system 900 can also be implemented as or incorporated into various devices, such as a telematics system, for example, in a vehicle. In other examples, any other machine capable of executing a set of instructions (sequential or otherwise) that specify actions to be taken by that machine may be used. The computer system 900 may be implemented using electronic devices that provide voice, audio, video or data communication. While a single computer system 900 is illustrated, the term "system" may include any collection of systems or sub-systems that individually or jointly execute a set, or multiple sets, of instructions to perform one or more computer functions.

The computer system 900 may include a processor 902, such as a central processing unit (CPU), a graphics processing unit (GPU), a digital signal processor (DSP), or some combination of different or the same processors. The processor 902 may be a component in a variety of systems. For example, the processor 902 may be part of a head unit or amplifier in a vehicle. The processor 902 may be one or more general processors, digital signal processors, application specific integrated circuits, field programmable gate arrays, digital circuits, analog circuits, combinations thereof, or other now known or later developed devices for analyzing and processing data. The processor 902 may implement a software program, such as code generated manually or programmed.

The processor 902 may operate and control at least a portion of the audio loudness control system 210. The term "module" may be defined to include one or more executable modules. The modules may be hardware or a combination of hardware and software. Thus, the modules may include software, hardware, firmware, or some combination thereof executable by a processor, such as processor 902. For example, the modules may be a memory, such as memory 904, or another memory device, storing instructions executable by the processor 902 or other processor. Alternatively, or in addition, modules may include various devices, components, circuits, gates, circuit boards, and the like that are executable, directed, or controlled for performance by the processor 902. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof.

The computer system 900 may include a memory 904, such as a memory 904 that can communicate via a bus 908. The memory 904 may be a main memory, a static memory, or a dynamic memory. The memory 904 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one example, the memory 904 includes a cache or random access memory for the processor 902. In alternative examples, the memory 904 may be separate from the processor 902, such as a cache memory of a processor, the system memory, or other memory. The memory 904 may include an external storage device or database for storing data. Examples include a hard drive, compact disc ("CD"), digital video disc ("DVD"), memory card, memory stick, floppy disc, universal serial bus ("USB") memory device, or any other device operative to store data.

The computer system 900 may or may not further include a display unit 910, such as a liquid crystal display (LCD), an organic light emitting diode (OLED), a flat panel display, a solid state display, a cathode ray tube (CRT), a projector, or other now known or later developed display device for outputting determined information. The display 910 may act as an interface for the user to control the functioning of the processor 902, or specifically as an interface with the software stored in the memory 904.

The computer system 900 may include an input device 912 configured to allow a user to interact with any of the components of computer system. The input device 912 may be a microphone to receive voice commands, a keypad, a keyboard, or a cursor control device, such as a mouse, or a joystick, touch screen display, remote control or any other device operative to interact with the computer system 900. A user of the audio loudness control system may, for example, input criteria or conditions to be considered by the audio loudness control system and/or the telematics system.

The computer system 900 may include computer-readable medium that includes instructions or receives and executes instructions responsive to a propagated signal so that a device connected to a network 926 can communicate voice, video, audio, images or any other data over the network 926. The instructions may be transmitted or received over the network 926 via a communication port or interface 920, or using a bus 908. The communication port or interface 920 may be a part of the processor 902 or may be a separate component. The communication port 920 may be created in software or may be a physical connection in hardware. The communication port 920 may be configured to connect with a network 926, external media, the display 910, or any other components in the computer system 900, or combinations thereof. The connection with the network 926 may be a physical connection, such as a wired Ethernet connection or may be established wirelessly. The additional connections with other components of the computer system 900 may be physical connections or may be established wirelessly. The network 926 may alternatively be directly connected to the bus 908.

The network 926 may include wired networks, wireless networks, Ethernet AVB networks, or combinations thereof. The wireless network may be a cellular telephone network, an 802.11, 802.16, 802.20, 802.1Q or WiMax network. Further, the network 926 may be a public network, such as the Internet, a private network, such as an intranet, or combinations thereof, and may utilize a variety of networking protocols now available or later developed including, but not limited to TCP/IP based networking protocols. One or more components of the audio loudness control system may communicate with each other by or through the network 926.

Test Results

Results of a series of objective tests were performed to evaluate the effectiveness of the audio loudness control system. The tests were conducted to evaluate the ability of the audio loudness control system to equalize the loudness of various audio signals when change occurred, such as audio signals from various audio sources or when the audio content changed, as well as to verify that the audio loudness control system does not alter the spectrum of the audio signal.

Figure 10:
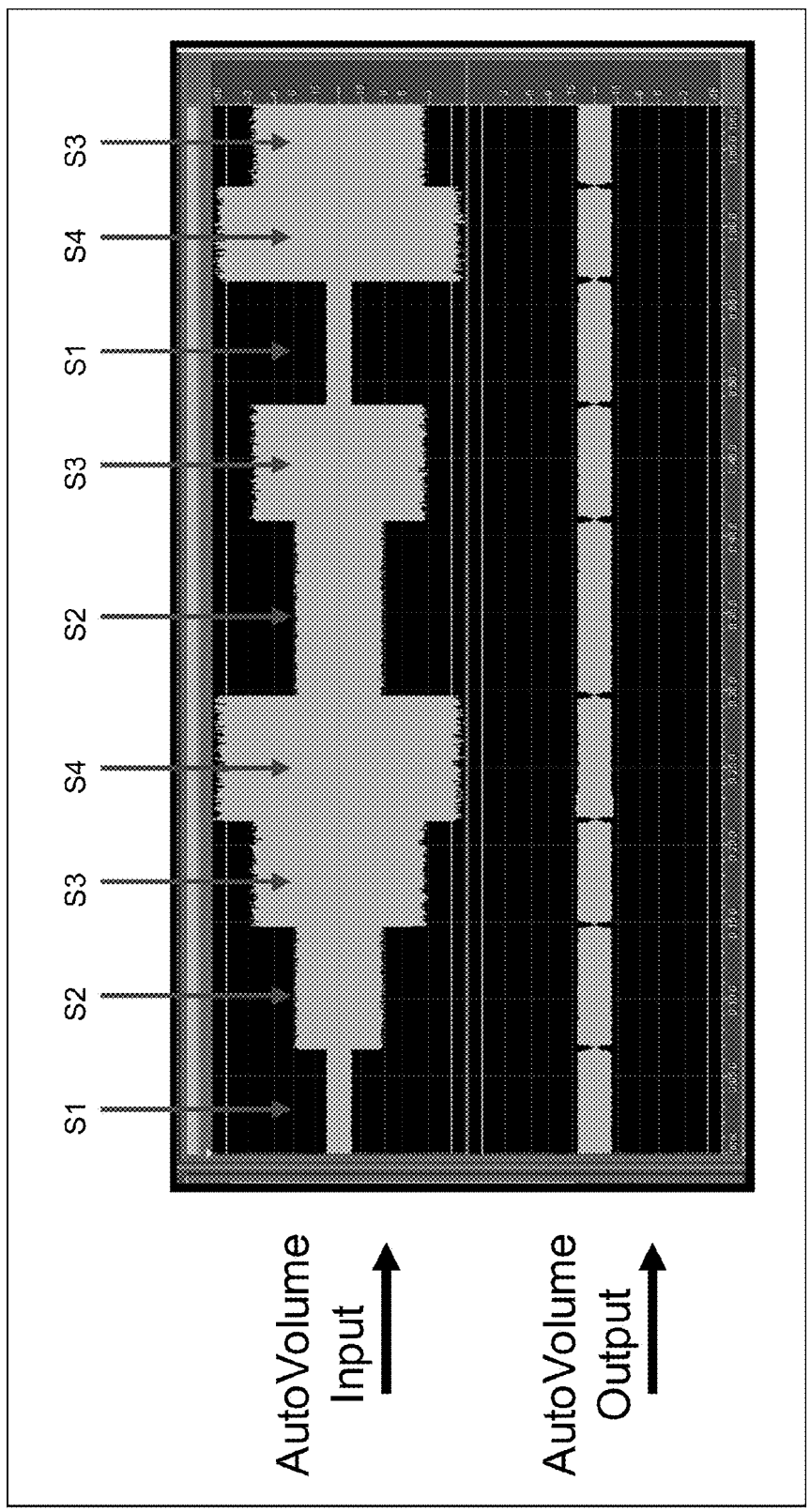
FIG. 10 is an example of test operation of the audio loudness control system using white noise test data.

FIG. 10 is a diagram plot of an example white noise input signal. Assume there are four audio sources, such as radio stations (audio sources S1 through S4) all playing the same song (in this case white noise) at different levels. The top curve shows the result of switching between the 4 radio stations (audio sources S1 through S4) without processing with the audio loudness control system. It can be seen that in this case there are large differences in the loudness (level) of the signal over time. The bottom curve shows how the loudness (level) of each of these same 4 radio stations (audio sources S1 through S4) is altered with processing by the audio loudness control system. In FIG. 10, the audio loudness control system may boost the audio signal of the audio source S1 with the loudness gain value (Gadj). For audio sources S2, S3, and S4, the audio loudness control system may apply different loudness gain values (Gadj) to attenuate the respective audio signals in order to make the energy level of audio signals provided from the four audio sources substantially similar. The short dropouts in the lower curve are a result of the software-based head unit simulator which briefly mutes the signal when the source (radio station) is changed.

Figure 11:
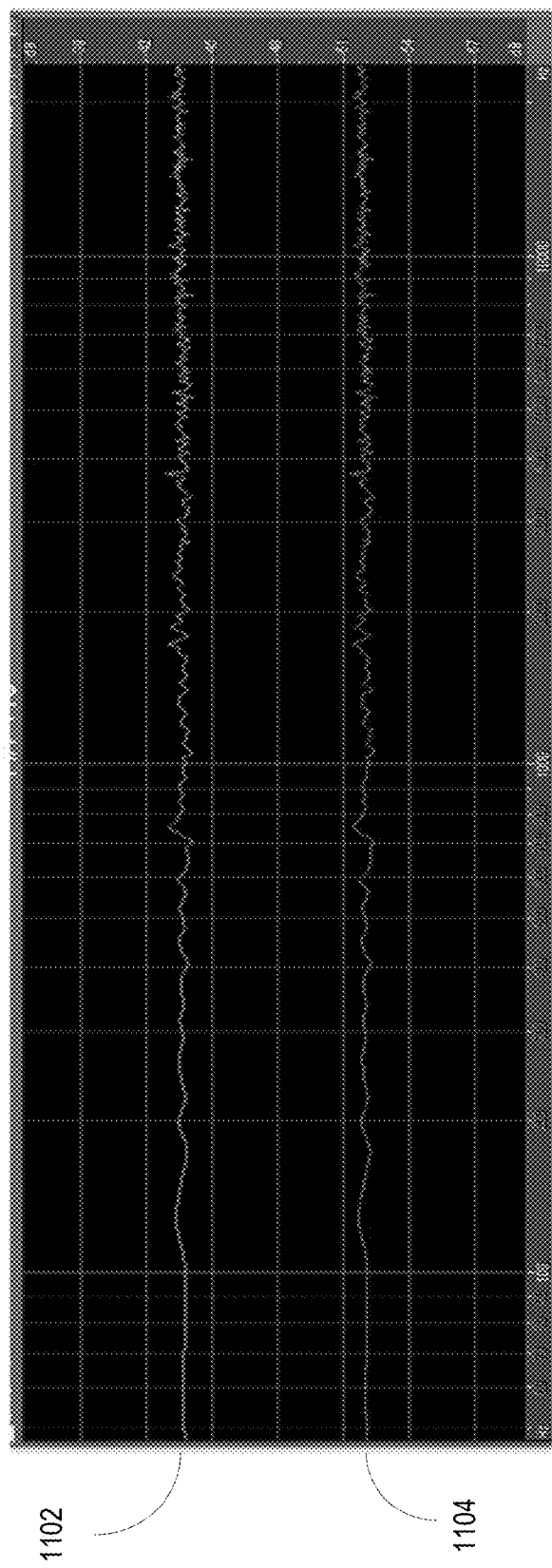
FIG. 11 is an example plot diagram illustrating that none of the frequency spectra of white noise is lost due to processing by the audio loudness control system.

The curves in the example of FIG. 11 show the spectra of white noise signals. The top curve 1102 is a white noise signal that is unprocessed by the audio loudness control system (ie, system off), and the bottom curve 1104 depicts the white noise signal with the audio loudness control system turned on. In FIG. 11, the first curve 1102 and the second curve 1104 are almost "perfectly" parallel to each other indicating that the audio loudness control system does not change the spectrum of the input signal. Note that in this example the vertical scale is in dB (3 dB per division).

Figure 12:
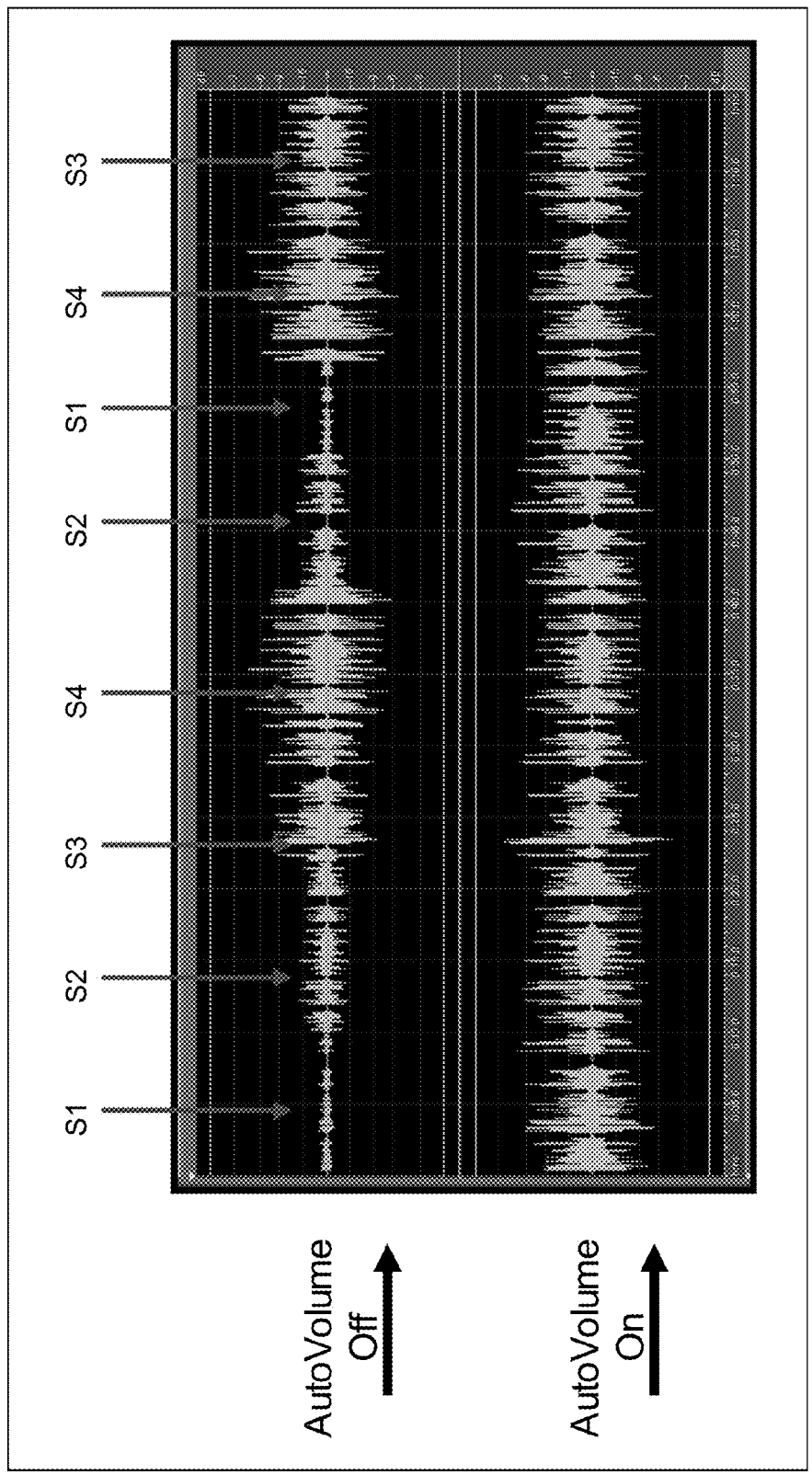
FIG. 12 is an example of test operation of the audio loudness control system using speech signals as test data.

FIG. 12 is an example diagram plot showing speech input signals as the audio signals. Assume there are four audio sources, such as radio stations (S1 through S4) all playing the same audio signal (in this case speech) at different levels. The top curve shows the audio signals of the 4 radio stations (S1 through S4) without processing by the audio loudness control system. The bottom curve shows the same audio signals after processing with the audio loudness control system. In the bottom curve, audio signals S1 and S2 are boosted by the gain adjust signal (Gadj), S4 is attenuated, and S3 remains substantially unchanged in order to obtain uniformity in perceived loudness by a user. The short dropouts in the lower curve are a result of the software-based head unit simulator used in this example simulation, which briefly mutes the signal when the source (radio station) is changed. However, any muting is not needed.

Figure 13:
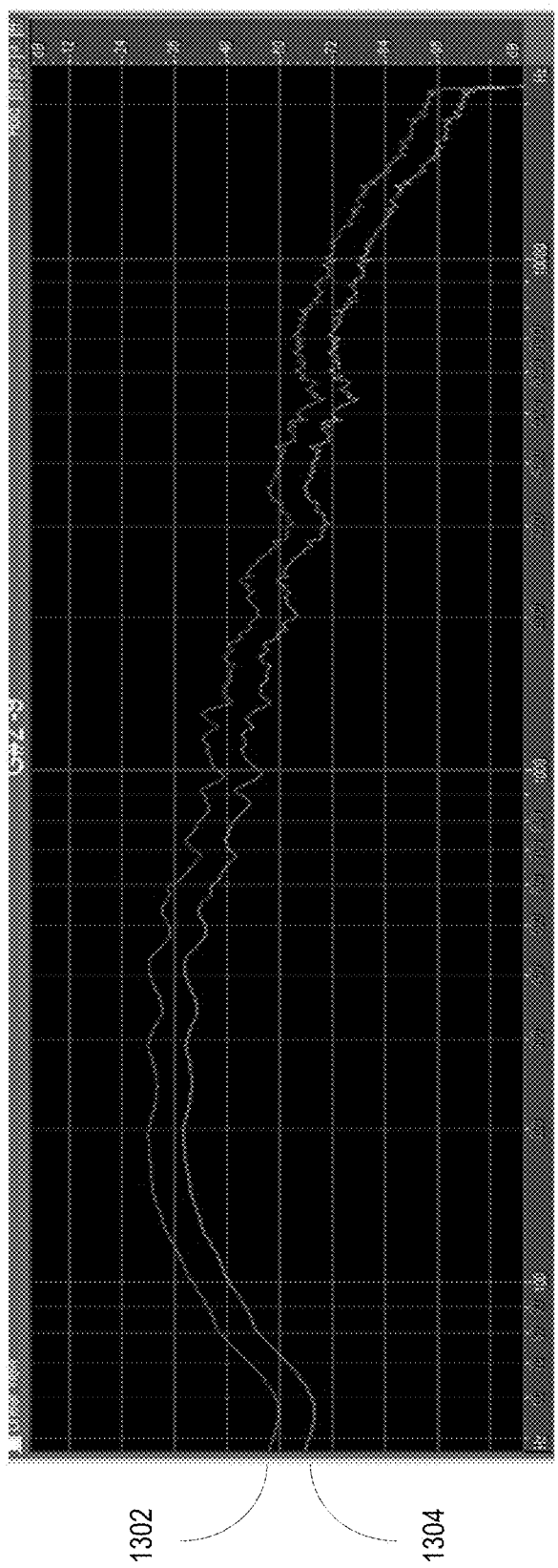
FIG. 13 is an example plot diagram illustrating that none of the frequency spectra of the speech signals is lost due to processing by the audio loudness control system.

FIG. 13 is another set of example curves showing the spectra of speech signals. A first curve 1302 is the speech signal unprocessed by the audio loudness control system (such as when the system is off) and the second curve 1304 is with processing turned on for the audio loudness control system. The curves are almost "perfectly" parallel to each other indicating that the audio loudness control system does not substantially change the spectrum of the input signal. Note that in this example the vertical scale is in dB (12 dB per division).

One example source of parameters in the form of messages (Dx) indicating the current selected audio source is a head unit in a vehicle, which provides audio signals to an amplifier in order to produce audible sound.

TABLE 1

Example Dx Messages from Head Unit to the Audio Loudness Control System

Name:

| Audio Source | integer [0 to 63] |
|---|---|
| subSource | integer [0 to 1023] | where the Audio Source parameter can identify which audio source is currently supplying audio signals, such as from the Head Unit to the amplifier. The Audio Sources of this example can include:

AM radio,
FM radio,
CD,
DVD,
Aux,
USB,
Satellite radio,
Bluetooth Audio,
Bluetooth Handsfree,
Any other audio sources connected to wireless or via wireline, or via another interface or device, to the Head Unit.

The subSource Dx message may provide further information regarding each of the Audio Sources. In the case where the Audio Source is a radio band (AM or FM), then the subSource may indicate which station is currently active. This is also true for Satellite radio, where the subSource may indicate the currently active station. In the case of CD, the subSource indicates which CD is active (in a multi-CD player).

In the case where there is no subSource for a particular Audio Source, then the subSource can be set to 0 (zero). As an example, if a vehicle has only one Aux input, then the subSource for the Aux input could always be set to zero. In other examples, the subSource may be omitted, and the additional information can be provided with the Audio Source message.

Figure 14:
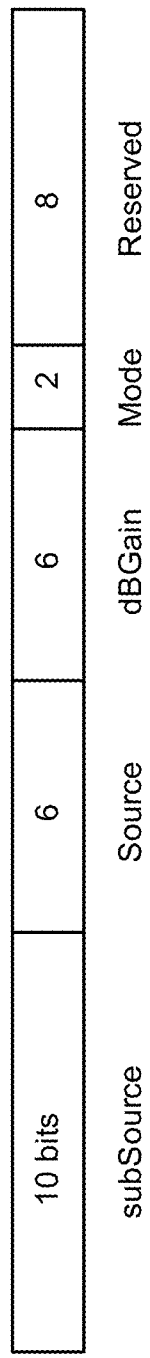
FIG. 14 is an example 32 bit word illustrating arrangement of the stored data.

Data stored in the loudness database may be stored in a predetermined configuration, such as a 32-bit word. As previously discussed, the data may be stored in non-volatile memory. An example of packing information in a 32 bit word for Non-Volatile Memory is illustrated in FIG. 14. In the example of FIG. 14, information generated by the audio loudness control system may be packed into a 32 bit word in order to be stored in non-volatile memory. The stored data provides information to help the audio loudness control system to better perform its tasks. In one example, there may be a quantity of 64 of these 32 bit words that can be stored and retrieved from non-volatile memory. In other examples, any quantity of words may be stored, and other word sizes, such as 64 bit, 128 bit, or 256 bit may be used.

The audio loudness control system may take care of packing and unpacking this data. Therefore the role of the processor is to store and retrieve this data at the appropriate time. When the system is powered up for the very first time, the values in the non-volatile memory should all be set to 0 (zero).

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An audio loudness control system comprising:
a processor;
a loudness adjuster module executed by the processor to dynamically determine an adjustment of a loudness level of an audio signal and a timing of performance of the adjustment based on parameters related to the audio signal that are available to the loudness adjuster module; and
a gain adjustment module executed by the processor to dynamically attenuate, boost or pass through the audio signal in accordance with the timing of performance and the adjustment of the loudness level determined by the loudness adjuster module,
where the loudness adjuster module is executed by the processor to receive the audio signal and determine a measured loudness of the audio signal, the loudness adjuster module further executed to compare the measured loudness of the audio signal to a target loudness, and determine the timing and the adjustment of the loudness level of the audio signal based on the comparison.

2. The audio loudness control system of claim 1, where the loudness adjuster module is executed to determine the timing of performance of the adjustment of the loudness level of the audio signal as being within an initial adaptation period that begins upon initial receipt of the audio signal and ends after a determined window of time has elapsed.

3. The audio loudness control system of claim 2, where the loudness adjuster module is executed to enter a limited adaptation period after the initial adaptation period in response to the audio loudness control system being in a selective adjust mode, the limited adaptation period being a determined period of time in which the adjustment of the loudness level remains substantially unchanged by the loudness adjuster module.

4. The audio loudness control system of claim 3, where the loudness adjuster module is executed to enter a second chance adaptation period after the limited adaptation period, the second chance adaptation period being a determined period of time in which a loudness adaptation rate is substantially similar to during the initial adaptation period.

5. The audio loudness control system of claim 2, where the loudness adjuster module is executed to enter an ongoing continuous adjust period after the initial adaptation period in response to the audio loudness control system being in a continuous adjust mode, the ongoing continuous adjust period being a period of time in which selective dynamic adjustment of the loudness level occurs at a loudness adaptation rate that is lower than during the initial adaptation period.

6. The audio loudness control system of claim 1, where the parameters received by the loudness adjuster module include the audio signal, and identification of a source of the audio signal.

7. The audio loudness control system of claim 1, where the parameters associated with the audio signal are received by the loudness adjuster in the audio signal or in a message included with the audio signal.

8. The audio loudness control system of claim 1, further comprising a database in communication with the loudness adjuster module, where the loudness adjuster module is configured to extract loudness related settings or parameters from the database that are associated with a source of the audio signal.

9. The audio loudness control system of claim 1, where the processor is executed to use a microphone signal in a closed loop control of the gain adjustment module.

10. A non-transitory computer readable storage medium configured to store instructions executable by a processor, the non-transitory computer readable storage medium comprising:
instructions executed by the processor to receive an audio signal from a source;
instructions executed by the processor to determine a measured loudness value based on parameters related to the audio signal;
instructions executed by the processor to dynamically adjust a loudness gain adjust signal to adjust the audio signal based on the parameters and a timing of application;
instructions executed by the processor to determine the timing of application; and
instructions executed by the processor to adjust a target loudness value before comparison with the measured loudness value, the target loudness value being adjusted based on the parameters, and wherein the result of the comparison is used to determine the timing of application.

11. The non-transitory computer readable storage medium of claim 10, further comprising instructions to vary the dynamic adjustment of the loudness gain adjust signal so that changes in loudness of an audio signal transition at a predetermined rate of change.

12. The non-transitory computer readable storage medium of claim 11, further comprising instructions executed by the processor to selectively suspend and enable variation in the dynamic adjustment of the loudness gain adjust signal to effect the predetermined rate of change in response to an operational mode of an audio loudness system.

13. The non-transitory computer readable storage medium of claim 10, where the instructions to dynamically adjust a loudness gain adjust signal comprise instructions to compare the measured loudness value to the target loudness value; and instructions to dynamically adjust the loudness gain adjust signal based on differences between the measured loudness value and the target loudness value.

14. A method of audio loudness control comprising:
receiving an audio signal with a processor;
dynamically adjusting a loudness gain adjust signal with the processor to adjust a loudness level of the audio signal;
detecting with the processor that the audio signal has changed;
dynamically adjusting the loudness gain adjust signal with the processor, the loudness gain adjust signal dynamically adjusted at a first predetermined adaptation rate to adjust the loudness level of the audio signal to be substantially similar to the loudness level of the audio signal prior to the change; and
following a predetermined period of time after the change is detected, the processor dynamically adjusting the loudness gain adjust signal at a second predetermined adaptation rate, the second predetermined adaptation rate being different than the first predetermined adaptation rate.

15. The method of claim 14, where detecting with the processor that the audio signal has changed comprises detecting one of a change in content of the audio signal or a change in a source of the audio signal.

16. The method of claim 14, where the second predetermined adaptation rate is less than the first predetermined adaptation rate.

17. An audio loudness control system comprising:
a processor;
a loudness adjuster module executed by the processor to dynamically determine an adjustment of a loudness level of an audio signal and a timing of performance of the adjustment based on parameters related to the audio signal that are available to the loudness adjuster module; and
a gain adjustment module executed by the processor to dynamically attenuate, boost or pass through the audio signal in accordance with the timing of performance and the adjustment of the loudness level determined by the loudness adjuster module,
where the loudness adjuster module is executed to determine the timing of performance of the adjustment of the loudness level of the audio signal as being within an initial adaptation period that begins upon initial receipt of the audio signal and ends after a determined window of time has elapsed,
where the loudness adjuster module is executed to enter a limited adaptation period after the initial adaptation period in response to the audio loudness control system being in a selective adjust mode, the limited adaptation period being a determined period of time in which the adjustment of the loudness level remains substantially unchanged by the loudness adjuster module, and
where the loudness adjuster module is executed to enter a second chance adaptation period after the limited adaptation period, the second chance adaptation period being a determined period of time in which a loudness adaptation rate is substantially similar to during the initial adaptation period.

18. An audio loudness control system comprising:
a processor;
a loudness adjuster module executed by the processor to dynamically determine an adjustment of a loudness level of an audio signal and a timing of performance of the adjustment based on parameters related to the audio signal that are available to the loudness adjuster module; and
a gain adjustment module executed by the processor to dynamically attenuate, boost or pass through the audio signal in accordance with the timing of performance and the adjustment of the loudness level determined by the loudness adjuster module,
where the loudness adjuster module is executed to determine the timing of performance of the adjustment of the loudness level of the audio signal as being within an initial adaptation period that begins upon initial receipt of the audio signal and ends after a determined window of time has elapsed, and
where the loudness adjuster module is executed to enter an ongoing continuous adjust period after the initial adaptation period in response to the audio loudness control system being in a continuous adjust mode, the ongoing continuous adjust period being a period of time in which selective dynamic adjustment of the loudness level occurs at a loudness adaptation rate that is lower than during the initial adaptation period.

19. An audio loudness control system comprising:
a processor;
a loudness adjuster module executed by the processor to dynamically determine an adjustment of a loudness level of an audio signal and a timing of performance of the adjustment based on parameters related to the audio signal that are available to the loudness adjuster module; and
a gain adjustment module executed by the processor to dynamically attenuate, boost or pass through the audio signal in accordance with the timing of performance and the adjustment of the loudness level determined by the loudness adjuster module,
where the parameters received by the loudness adjuster module include at least one microphone signal, and the loudness adjuster module is executed to perform a loudness measurement and a noise estimate based on the microphone signal, the loudness measurement and the noise estimate used by the loudness adjuster module to dynamically determine the timing and the level of adjustment of the audio signal, and
where the processor is executed to use the microphone signal in a closed loop control of the gain adjustment module.

* * * * *